(12) United States Patent
Sasaki et al.

(10) Patent No.: US 10,861,945 B2
(45) Date of Patent: Dec. 8, 2020

(54) SEMICONDUCTOR ELEMENT AND CRYSTALLINE LAMINATE STRUCTURE

(71) Applicants: TAMURA CORPORATION, Tokyo (JP); National Institute of Information and Communications Technology, Koganei (JP); National University Corporation Tokyo University of Agriculture and Technology, Fuchu (JP)

(72) Inventors: Kohei Sasaki, Tokyo (JP); Ken Goto, Tokyo (JP); Masataka Higashiwaki, Koganei (JP); Man Hoi Wong, Koganei (JP); Akinori Koukitu, Fuchu (JP); Yoshinao Kumagai, Fuchu (JP); Hisashi Murakami, Fuchu (JP)

(73) Assignees: TAMURA CORPORATION, Tokyo (JP); NATIONAL INSTITUTE OF INFORMATION AND COMMUNICATIONS TECHNOLOGY, Koganei (JP); NATIONAL UNIVERSITY CORPORATION TOKYO UNIVERSITY OF AGRICULTURE AND TECHNOLOGY, Fuchu (JP)

( * ) Notice: Subject to any disclaimer, the term of this patent is extended or adjusted under 35 U.S.C. 154(b) by 0 days.

(21) Appl. No.: 15/507,158

(22) PCT Filed: Aug. 18, 2015

(86) PCT No.: PCT/JP2015/073150
§ 371 (c)(1),
(2) Date: Feb. 27, 2017

(87) PCT Pub. No.: WO2016/031633
PCT Pub. Date: Mar. 3, 2016

(65) Prior Publication Data
US 2017/0278933 A1 Sep. 28, 2017

(30) Foreign Application Priority Data

Aug. 29, 2014 (JP) .................................. 2014-175913

(51) Int. Cl.
*H01L 29/24* (2006.01)
*H01L 29/812* (2006.01)
(Continued)

(52) U.S. Cl.
CPC ........ *H01L 29/24* (2013.01); *H01L 21/02414* (2013.01); *H01L 21/02433* (2013.01);
(Continued)

(58) Field of Classification Search
CPC ..................... H01L 29/7869; H01L 21/02565
See application file for complete search history.

(56) References Cited

U.S. PATENT DOCUMENTS

| 9,437,689 B2 | 9/2016 | Sasaki et al. |
| 10,249,767 B2 | 4/2019 | Sasaki et al. |

(Continued)

FOREIGN PATENT DOCUMENTS

| CN | 103782392 A | 5/2014 |
| JP | 2013-056803 A | 3/2013 |

(Continued)

OTHER PUBLICATIONS

Notification of Transmittal of Translation of the International Preliminary Report on Patentability (PCT/IB/338) in PCT Application No. PCT/JP2015/073150 dated Mar. 9, 2017.
(Continued)

*Primary Examiner* — Samuel A Gebremariam
*Assistant Examiner* — Jonas T Beardsley
(74) *Attorney, Agent, or Firm* — McGinn I.P. Law Group, PLLC.

(57) ABSTRACT

A semiconductor element includes a high-resistivity substrate that includes a $\beta$-$Ga_2O_3$-based single crystal including
(Continued)

an acceptor impurity, a buffer layer on the high-resistivity substrate, the buffer layer including a β-$Ga_2O_3$-based single crystal, and a channel layer on the buffer layer, the channel layer including a β-$Ga_2O_3$-based single crystal including a donor impurity. A crystalline laminate structure includes a high-resistivity substrate that includes a β-$Ga_2O_3$-based single crystal including an acceptor impurity, a buffer layer on the high-resistivity substrate, the buffer layer including a β-$Ga_2O_3$-based single crystal, and a donor impurity-containing layer on the buffer layer, the donor impurity-containing layer including a β-$Ga_2O_3$-based single crystal including a donor impurity.

7 Claims, 10 Drawing Sheets

(51) Int. Cl.
  *H01L 21/02* (2006.01)
  *H01L 29/36* (2006.01)
  *H01L 29/04* (2006.01)
  *H01L 29/10* (2006.01)
  *H01L 29/51* (2006.01)

(52) U.S. Cl.
  CPC .. *H01L 21/02483* (2013.01); *H01L 21/02565* (2013.01); *H01L 21/02576* (2013.01); *H01L 21/02581* (2013.01); *H01L 29/045* (2013.01); *H01L 29/105* (2013.01); *H01L 29/36* (2013.01); *H01L 29/812* (2013.01); *H01L 29/517* (2013.01)

(56) References Cited

U.S. PATENT DOCUMENTS

| | | | | |
|---|---|---|---|---|
| 2006/0150891 | A1* | 7/2006 | Ichinose | C30B 23/02 117/2 |
| 2006/0214193 | A1* | 9/2006 | Hayamura | H01L 29/66462 257/213 |
| 2014/0217469 | A1* | 8/2014 | Sasaki | H01L 29/812 257/192 |
| 2014/0217470 | A1 | 8/2014 | Sasaki et al. | |
| 2016/0300953 | A1 | 10/2016 | Sasaki et al. | |

FOREIGN PATENT DOCUMENTS

| | | |
|---|---|---|
| JP | WO2013/035841 A1 | 3/2013 |
| WO | WO 2013/035841 A1 | 3/2013 |
| WO | WO 2013/069729 A1 | 5/2013 |

OTHER PUBLICATIONS

International Search Report (ISR) (PCT Form PCT/ISA/210), in PCT/JP2015/073150 dated Oct. 6, 2015.
Taiwan Office Action, dated Oct. 18, 2018 in Taiwanese Application No. 104127704 and English Translation thereof.
Chinese Office Action, dated Jan. 13, 2020, in Chinese Patent Application No. 201580046341.5 and English Translation thereof.

* cited by examiner

SEMICONDUCTOR ELEMENT AND CRYSTALLINE LAMINATE STRUCTURE

TECHNICAL FIELD

The invention relates to a semiconductor element and a crystalline laminate structure.

BACKGROUND ART

MESFETs (Metal Semiconductor Field Effect Transistor) are known as conventional semiconductor elements in which a channel layer containing a donor impurity is formed on a high-resistivity $Ga_2O_3$-based substrate containing an acceptor impurity (see, e.g., PTL 1).

CITATION LIST

Patent literature

[PTL 1]
WO 2013/069729

SUMMARY OF INVENTION

Technical Problem

In the MESFET disclosed in PTL 1, however, the acceptor impurity may be diffused from the high-resistivity $Ga_2O_3$ substrate into the channel layer such that the resistance of the channel layer increases due to carrier compensation.

Therefore, it is an object of the invention to provide a semiconductor element that prevents the increase in resistance of the channel layer, as well as a crystalline laminate structure that is available for the manufacture of the element.

To achieve the above object, an aspect of the invention provides a semiconductor element defined by [1] to [6] below.

[1] A semiconductor element, comprising: a high-resistivity substrate that comprises a $\beta$-$Ga_2O_3$-based single crystal comprising an acceptor impurity; a buffer layer on the high-resistivity substrate, the buffer layer comprising a $\beta$-$Ga_2O_3$-based single crystal; and a channel layer on the buffer layer, the channel layer comprising a $\beta$-$Ga_2O_3$-based single crystal comprising a donor impurity.

[2] The semiconductor element according to [1], wherein the buffer layer and the channel layer comprises the acceptor impurity diffused from the high-resistivity substrate, wherein a concentration of the acceptor impurity of the channel layer is lower than a concentration of the acceptor impurity of the buffer layer, and wherein a concentration of the donor impurity of the channel layer is higher than a concentration of the acceptor impurity of the channel layer.

[3] The semiconductor element according to [1], wherein a lower layer of the buffer layer on a side of the high-resistivity substrate comprises the acceptor impurity diffused from the high-resistivity substrate, and wherein an upper layer of the buffer layer on a side of the channel layer and the channel layer do not comprise the acceptor impurity diffused from the high-resistivity substrate.

[4] The semiconductor element according to any one of [1] to [3], wherein a principal surface of the high-resistivity substrate has a plane orientation of (001).

[5] The semiconductor element according to any one of [1] to [3], wherein the acceptor impurity comprises at least one of Fe, Be, Mg and Zn.

[6] The semiconductor element according to any one of [1] to [3], comprising a MESFET or MISFET.

To achieve the above object, another aspect of the invention provides a crystalline laminate structure defined by [7] to [11] below.

[7] A crystalline laminate structure, comprising: a high-resistivity substrate that comprises a $\beta$-$Ga_2O_3$-based single crystal comprising an acceptor impurity; a buffer layer on the high-resistivity substrate, the buffer layer comprising a $\beta$-$Ga_2O_3$-based single crystal; and a donor impurity-containing layer on the buffer layer, the donor impurity-containing layer comprising a $\beta$-$Ga_2O_3$-based single crystal comprising a donor impurity.

[8] The crystalline laminate structure according to [7], wherein the buffer layer and the donor impurity-containing layer comprise the acceptor impurity diffused from the high-resistivity substrate, wherein a concentration of the acceptor impurity of the donor impurity-containing layer is lower than a concentration of the acceptor impurity of the buffer layer, and wherein a concentration of the donor impurity of the donor impurity-containing layer is higher than a concentration of the acceptor impurity of the donor impurity-containing layer.

[9] The crystalline laminate structure according to [7], wherein a lower layer of the buffer layer on a side of the high-resistivity substrate comprises the acceptor impurity diffused from the high-resistivity substrate, and wherein an upper layer of the buffer layer on a side of the donor impurity-containing layer and the donor impurity-containing layer do not comprise the acceptor impurity diffused from the high-resistivity substrate.

[10] The crystalline laminate structure according to any one of [7] to [9], wherein a principal surface of the high-resistivity substrate has a plane orientation of (001).

[11] The crystalline laminate structure according to any one of [7] to [9], wherein the acceptor impurity comprises at least one of Fe, Be, Mg and Zn.

Advantageous Effect of the Invention

According to the invention, a semiconductor element can be provided that prevents the increase in resistance of the channel layer, as well as a crystalline laminate structure that is available for the manufacture of the element.

DESCRIPTION OF EMBODIMENTS

First Embodiment

The first embodiment employs a MESFET as the semiconductor element.

(Configuration of Semiconductor Element)

Figure 1:
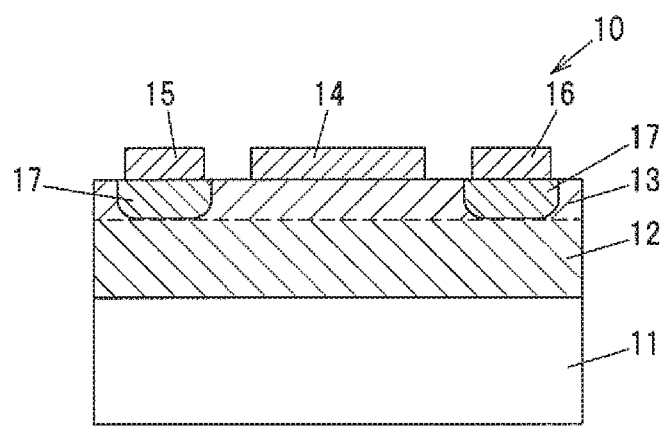
FIG. 1 is a vertical cross-sectional view showing a $Ga_2O_3$-based semiconductor element in a first embodiment.

FIG. 1 is a vertical cross-sectional view showing a $Ga_2O_3$-based semiconductor element 10 in the first embodiment. The $Ga_2O_3$-based semiconductor element 10 has a buffer layer 12 formed on a high-resistivity substrate 11, a channel layer 13 formed on the buffer layer 12, a source electrode 15 and a drain electrode 16 which are formed on the channel layer 13, a gate electrode 14 formed on the channel layer 13 so as to be located between the source electrode 15 and the drain electrode 16, and contact regions 17 formed in the channel layer 13 so as to be located under the source electrode 15 and the drain electrode 16.

The high-resistivity substrate 11 is a substrate formed of a $\beta$-$Ga_2O_3$-based single crystal doped with an acceptor impurity such as Fe, Be, Mg or Zn and has high-resistivity due to the doping of the acceptor impurity. The $\beta$-$Ga_2O_3$-based single crystal here is a $\beta$-$Ga_2O_3$ single crystal, or is a $\beta$-$Ga_2O_3$ single crystal containing non-conductive impurities such as Al or In.

To form the high-resistivity substrate 11, for example, a Fe-doped high-resistivity $\beta$-$Ga_2O_3$ single crystal grown by, e.g., the EFG (Edge-defined Film-fed Growth) method is sliced and polished to a desired thickness.

The principal surface of the high-resistivity substrate 11 is, e.g., a surface rotated not less than 50° and not more than 90° from the (100) plane of the $\beta$-$Ga_2O_3$-based single crystal. In other words, an angle θ (0<θ≤90°) formed between the principal surface of the high-resistivity substrate 11 and the (100) plane is not less than 50°. Examples of the surface rotated not less than 50° and not more than 90° from the (100) plane include a (010) plane, a (001) plane, a (−201) plane, a (101) plane and a (310) plane.

When the principal surface of the high-resistivity substrate 11 is a surface rotated not less than 50° and not more than 90° from the (100) plane, it is possible to effectively suppress re-evaporation of raw materials of the $\beta$-$Ga_2O_3$-based crystal from the high-resistivity substrate 11 at the time of epitaxially growing the $\beta$-$Ga_2O_3$-based crystal on the high-resistivity substrate 11. In detail, where a percentage of the re-evaporated raw material during growth of the $\beta$-$Ga_2O_3$-based crystal at a growth temperature of 500° C. is defined as 0%, the percentage of the re-evaporated raw material can be suppressed to not more than 40% when the principal surface of the high-resistivity substrate 11 is a surface rotated not less than 50° and not more than 90° from the (100) plane. It is thus possible to use not less than 60% of the supplied raw material to form the $\beta$-$Ga_2O_3$-based crystal, which is preferable from the viewpoint of growth rate and manufacturing cost of the $\beta$-$Ga_2O_3$-based crystal.

In the $\beta$-$Ga_2O_3$ crystal, the (100) plane comes to coincide with the (310) plane when rotated by 52.5° about the c-axis and comes to coincide with the (010) plane when rotated by 90°. Meanwhile, the (100) plane comes to coincide with the (101) plane when rotated by 53.8° about the b-axis, comes to coincide with the (001) plane when rotated by 76.3° and comes to coincide with the (−201) plane when rotated by 53.8°.

Alternatively, the principal surface of the high-resistivity substrate 11 is, e.g., the (010) plane, or a surface rotated within an angle range of not more than 37.5° with respect to the (010) plane. In this case, it is possible to provide a steep interface between the high-resistivity substrate 11 and the buffer layer 12 and it is also possible to highly accurately control the thickness of the buffer layer 12. In addition, it is possible to prevent uneven element uptake by the buffer layer 12 and thereby to obtain the homogeneous buffer layer 12. Note that, the (010) plane comes to coincide with the (310) plane when rotated by 37.5° about the c-axis.

When (001) is the plane orientation of the principal surface of the high-resistivity substrate 11, the epitaxial growth rate of the $\beta$-$Ga_2O_3$-based single crystal on the high-resistivity substrate 11 is particularly high among those plane orientations and it is possible to suppress diffusion of the acceptor impurity from the high-resistivity substrate 11 into the buffer layer 12 and the channel layer 13 which are formed on the high-resistivity substrate 11. Thus, the plane orientation of the principal surface of the high-resistivity substrate 11 is preferably (001).

The buffer layer 12 is formed of a $\beta$-$Ga_2O_3$-based single crystal containing the acceptor impurity diffused from the high-resistivity substrate 11.

The buffer layer 12 is formed by epitaxially growing a $\beta$-$Ga_2O_3$-based single crystal on the high-resistivity substrate 11 used as a base substrate. The acceptor impurity diffuses from the high-resistivity substrate 11 into the buffer layer 12 during the epitaxial growth.

The channel layer 13 is formed of a $\beta$-$Ga_2O_3$-based single crystal containing a donor impurity. The donor impurity is preferably a Group IV element such as Si or Sn. Unlike high-electron-mobility transistor, a heterojunction between an i-type layer and an n-type layer is not required here. Therefore, a composition ratio in the $\beta$-$Ga_2O_3$-based single crystal as a base crystal of the buffer layer 12 may be the same as that of the channel layer 13.

Since the base crystal of the channel layer 13 is the $\beta$-$Ga_2O_3$-based single crystal in the same manner as the buffer layer 12, the buffer layer 12 and the channel layer 13 can be continuously formed by epitaxial growth. The thickness of the channel layer 13 is, e.g., about 10 to 1000 nm.

The method of introducing the donor impurity into the channel layer 13 is, e.g., ion implantation of donor impurity into a grown β-Ga$_2$O$_3$ single crystal film, or epitaxial growth of a β-Ga$_2$O$_3$ single crystal film containing a donor impurity.

In case of using the former method, for example, a 300 nm-thick β-Ga$_2$O$_3$ single crystal film is homoepitaxially grown on the buffer layer 12 by the HVPE method or the molecular beam epitaxy method and Si is subsequently implanted into the whole surface of the film by multistage ion implantation.

In case of using the latter method, for example, a 300 nm-thick β-Ga$_2$O$_3$ single crystal film containing Sn is homoepitaxially grown on the buffer layer 12 by the HVPE method or the molecular beam epitaxy method.

The channel layer 13 contains the acceptor impurity diffused from the high-resistivity substrate 11 but has a lower acceptor impurity concentration than the buffer layer 12 due to being located further from the high-resistivity substrate 11 than the buffer layer 12. In addition, in the channel layer 13, the donor impurity concentration is higher than the acceptor impurity concentration, hence, n-type conductivity.

The gate electrode 14, the source electrode 15 and the drain electrode 16 are formed of, e.g., a metal such as Au, Al, Ti, Sn, Ge, In, Ni, Co, Pt, W, Mo, Cr, Cu or Pb, an alloy containing two or more of such metals, or a conductive compound such as ITO, or alternatively may have a two-layer structure composed of two different metals, e.g., Ti/Al, Ti/Au, Ti/Pt, Al/Au, Ni/Au or Au/Ni.

To form the contact regions 17, a donor impurity such as Si or Sn is doped into the channel layer 13 by the ion implantation method, etc., and activated by annealing. The donor impurity concentration of the contact regions 17 is higher than the donor impurity concentration of the channel layer 13 and the contact regions 17 are in ohmic contact with the source electrode 15 and the drain electrode 16.

As described above, the Ga$_2$O$_3$-based semiconductor element 10 is manufactured using a crystalline laminate structure having the high-resistivity substrate 11, the buffer layer 12 on the high-resistivity substrate 11 and a donor impurity-containing layer on the buffer layer 12. The gate electrode 14, the source electrode 15 and the drain electrode 16 are connected to the crystalline laminate structure in which the contact regions 17 are formed, thereby obtaining the Ga$_2$O$_3$-based semiconductor element 10. The donor impurity-containing layer of the crystalline laminate structure here is a layer serving as a channel layer once formed into the Ga$_2$O$_3$-based semiconductor element 10 and is the same as the channel layer 13.

The Ga$_2$O$_3$-based semiconductor element 10 can be a normally-on type or a normally-off type depending on the donor concentration and the thickness of the channel layer 13 directly below the gate electrode 14.

In case that the Ga$_2$O$_3$-based semiconductor element 10 is a normally-on type, the source electrode 15 is electrically connected to the drain electrode 16 via the channel layer 13. Therefore, if a voltage is applied between the source electrode 15 and the drain electrode 16 in a state that a voltage is not applied to the gate electrode 14, a current passes through from the source electrode 15 to the drain electrode 16. On the other hand, if a voltage is applied to the gate electrode 14, a depletion layer is formed in the channel layer 13 in a region under the gate electrode 14 and a current does not pass through from the source electrode 15 to the drain electrode 16 even if a voltage is applied between the source electrode 15 and the drain electrode 16.

In case that the Ga$_2$O$_3$-based semiconductor element 10 is a normally-off type, a current does not pass through in a state that a voltage is not applied to the gate electrode 14 even if a voltage is applied between the source electrode 15 and the drain electrode 16. On the other hand, if a voltage is applied to the gate electrode 14, the depletion layer in the channel layer 13 in the region under the gate electrode 14 is narrowed, and a current passes through from the source electrode 15 to the drain electrode 16 if a voltage is applied between the source electrode 15 and the drain electrode 16.

Figure 2:
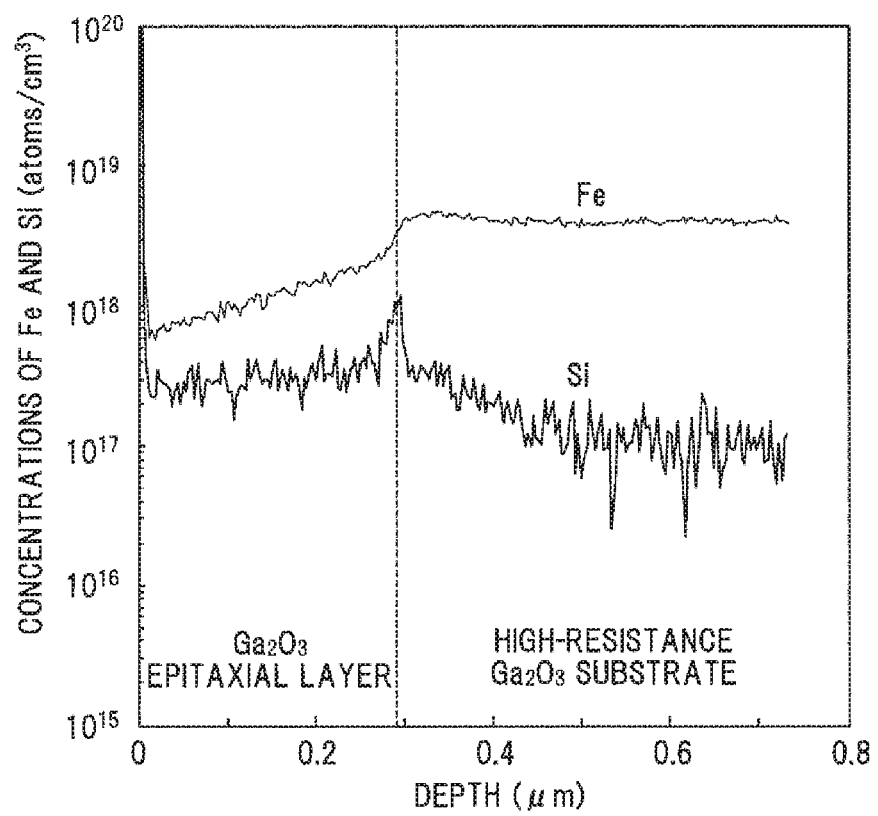
FIG. 2 is a measured data diagram showing the relationship between the depth from a surface of a $Ga_2O_3$ epitaxial layer and Fe and Si concentrations when the $Ga_2O_3$ epitaxial layer containing Si as a donor impurity is grown on a high-resistivity $Ga_2O_3$ substrate containing Fe as an acceptor impurity.

FIG. 2 is a measured data diagram showing the relationship between the depth from a surface of a Ga$_2$O$_3$ epitaxial layer and Fe and Si concentrations when an undoped Ga$_2$O$_3$ epitaxial layer having a thickness of about 300 nm is grown on a high-resistivity Ga$_2$O$_3$ substrate containing Fe as an acceptor impurity and ions of Si as a donor impurity are subsequently implanted into the epitaxial layer.

As shown in FIG. 2, Fe in the high-resistivity Ga$_2$O$_3$ substrate is diffused into the Ga$_2$O$_3$ epitaxial layer. Since the Fe concentration of the Ga$_2$O$_3$ epitaxial layer is as high as $6 \times 10^{17}$ cm$^{-3}$ even in the vicinity of the surface which is the furthest from the high-resistivity Ga$_2$O$_3$ substrate, resistance of the Ga$_2$O$_3$ epitaxial layer is increased due to carrier compensation. It is not preferable to use such Ga$_2$O$_3$ epitaxial layer as an n-type channel layer.

Figure 3A:
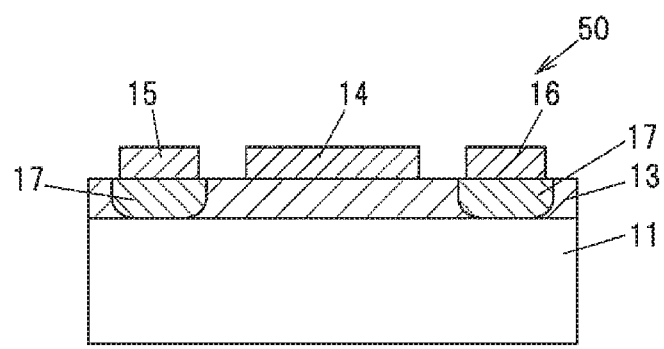
FIG. 3A is a vertical cross-sectional view showing a $Ga_2O_3$-based semiconductor element as Comparative Example in which a channel layer is directly formed on a high-resistivity substrate.
Figure 3B:
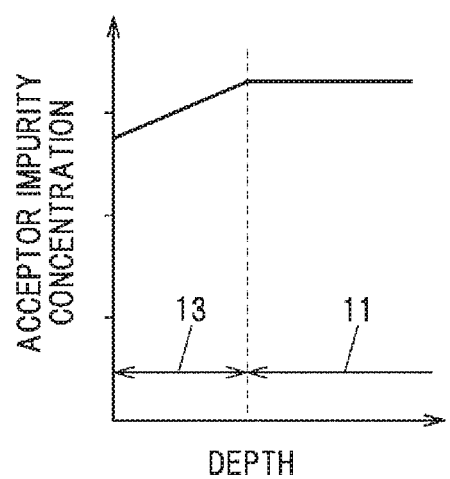
FIG. 3B is a graph conceptually showing the relationship between the depth from a surface of the channel layer and an acceptor impurity concentration in the $Ga_2O_3$-based semiconductor element of FIG. 3A.

FIG. 3A is a vertical cross-sectional view showing a Ga$_2$O$_3$-based semiconductor element 50 as Comparative Example in which the channel layer 13 is directly formed on the high-resistivity substrate 11. FIG. 3B is a graph conceptually showing the relationship between the depth from the surface of the channel layer 13 and an acceptor impurity concentration in the Ga$_2$O$_3$-based semiconductor element 50.

Figure 4A:
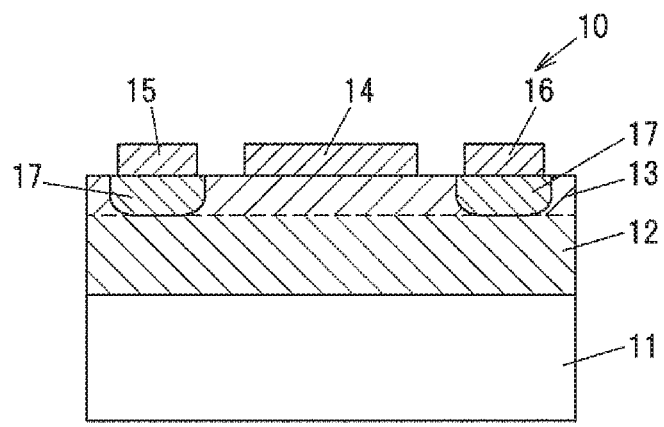
FIG. 4A is a vertical cross-sectional view showing the $Ga_2O_3$-based semiconductor element in the first embodiment in which the channel layer is formed on the high-resistivity substrate via a buffer layer.
Figure 4B:
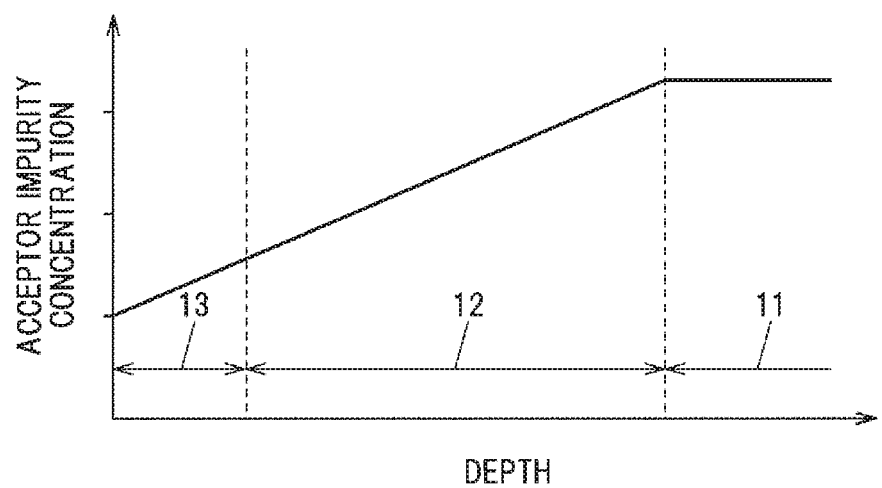
FIG. 4B is a graph conceptually showing the relationship between the depth from a surface of the channel layer and an acceptor impurity concentration in the $Ga_2O_3$-based semiconductor element of FIG. 4A.

FIG. 4A is a vertical cross-sectional view showing the Ga$_2$O$_3$-based semiconductor element 10 in the first embodiment in which the channel layer 13 is formed on the high-resistivity substrate 11 via the buffer layer 12. FIG. 4B is a graph conceptually showing the relationship between the depth from the surface of the channel layer 13 and an acceptor impurity concentration in the Ga$_2$O$_3$-based semiconductor element 10.

In the Ga$_2$O$_3$-based semiconductor element 50, since the distance between the channel layer 13 and the high-resistivity substrate 11 is small, the concentration of the acceptor impurity such as Fe diffused from the high-resistivity substrate 11 shows only a small decrease with an increase in a diffusion distance, as shown in FIGS. 3A and 3B. The channel layer 13 thus contains a high concentration of acceptor impurity.

On the other hand, in the Ga$_2$O$_3$-based semiconductor element 10, since the distance between the channel layer 13 and the high-resistivity substrate 11 is large, the channel layer 13 contains a much lower concentration of the acceptor impurity diffused from the high-resistivity substrate 11, as shown in FIGS. 4A and 4B. Therefore, the acceptor impurity concentration of the channel layer 13 in the Ga$_2$O$_3$-based semiconductor element 10 is lower than that in the Ga$_2$O$_3$-based semiconductor element 50.

(Evaluation of Acceptor Impurity Diffusion)

Figure 5:
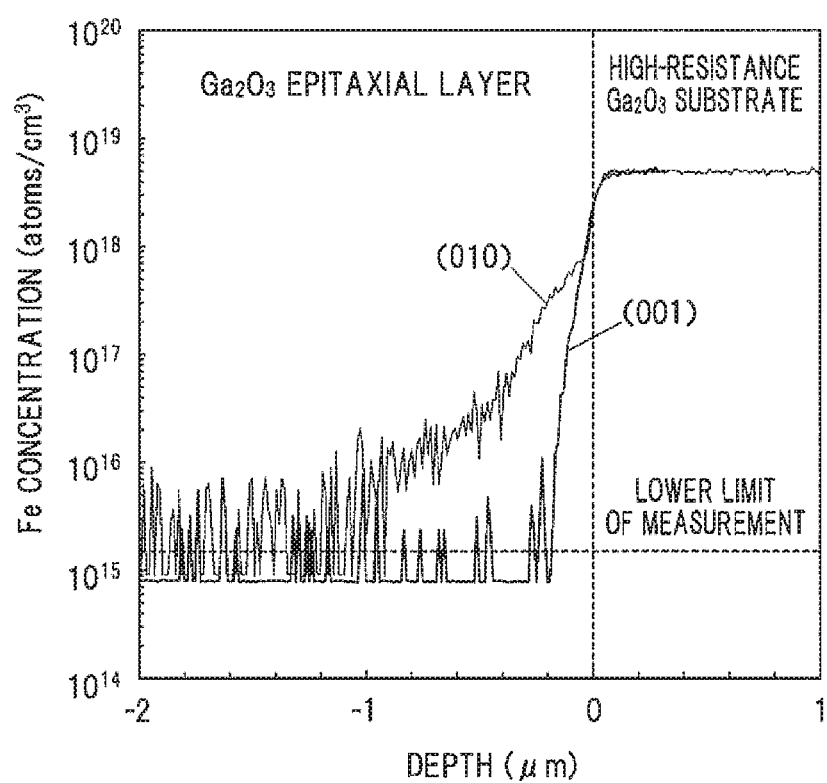
FIG. 5 is a measured data diagram showing the relationship between the depth and Fe concentration when a $Ga_2O_3$ epitaxial layer is grown on a high-resistivity $Ga_2O_3$ substrate containing Fe as an acceptor impurity.

FIG. 5 is a measured data diagram showing the relationship between the depth and Fe concentration when a Ga$_2$O$_3$ epitaxial layer is grown on a high-resistivity Ga$_2$O$_3$ substrate containing Fe as an acceptor impurity. A position of an interface between the high-resistivity Ga$_2$O$_3$ substrate and the Ga$_2$O$_3$ epitaxial layer is the origin of the depth.

The Fe concentration of the high-resistivity Ga$_2$O$_3$ substrate used in this measurement is $5 \times 10^{18}$ cm$^{-3}$. Meanwhile, the growth temperature of the $Ga_2O_3$ epitaxial layer used in this measurement is 1000° C.

The measured data when the plane orientation of the principal surface of the high-resistivity $Ga_2O_3$ substrate is (010) and the measured data when (001) are shown in FIG. 5. In each case, the Fe concentration of the $Ga_2O_3$ epitaxial layer decreases with an increase in a distance from the interface in a depth direction.

When the plane orientation of the principal surface of the high-resistivity $Ga_2O_3$ substrate is (010), the $Ga_2O_3$ epitaxial layer grows at a rate of about 0.3 μm/h and the Fe concentration of the $Ga_2O_3$ epitaxial layer becomes less than $1\times10^{16}$ $cm^{-3}$ in a region at a distance of about 1 μm from the interface in the depth direction. Therefore, in this case, the channel layer 13 having high conductivity can be obtained when the channel layer 13 is formed on the buffer layer 12 having a thickness of not less than 1 μm.

Meanwhile, when the plane orientation of the principal surface of the high-resistivity $Ga_2O_3$ substrate is (001), the $Ga_2O_3$ epitaxial layer grows at a rate of about 6 μm/h and the Fe concentration of the $Ga_2O_3$ epitaxial layer becomes less than $1\times10^{16}$ $cm^{-3}$ in a region at a distance of about 0.18 μm from the interface in the depth direction. Therefore, in this case, the channel layer 13 having high conductivity can be obtained when the channel layer 13 is formed on the buffer layer 12 having a thickness of not less than 0.18 μm.

The thinner buffer layer is preferable since manufacturing time or raw material consumption can be reduced. The plane orientation of the principal surface of the high-resistivity $Ga_2O_3$ substrate is preferably (001) since the thickness of the $Ga_2O_3$ epitaxial layer required to obtain the high-conductivity channel layer 13 is smaller, as described above.

The higher the growth temperature of the $Ga_2O_3$ epitaxial layer, the larger the amount of transferred Fe and the larger the thickness of the $Ga_2O_3$ epitaxial layer required to sufficiently reduce the Fe concentration. On the other hand, the lower the growth temperature of the $Ga_2O_3$ epitaxial layer, the smaller the amount of transferred Fe and the smaller the thickness of the $Ga_2O_3$ epitaxial layer required to sufficiently reduce the Fe concentration.

Although FIGS. 2 and 5 demonstrate that Fe in the high-resistivity substrate 11 is diffused into the buffer layer 12 and the channel layer 13, the acceptor impurity used in the present embodiment is not limited to Fe since diffusion occurs even when an element other than Fe is used as an acceptor impurity.

Figure 6A:
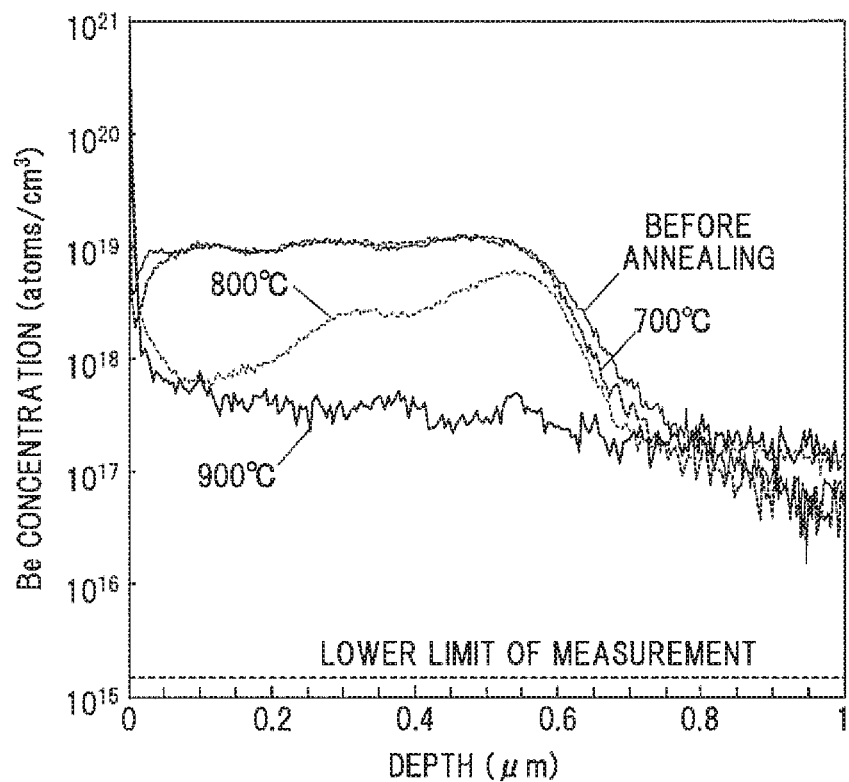
FIG. 6A is a measured data diagram showing the relationship between the depth from a surface of a $Ga_2O_3$ crystal film and Be concentration when the $Ga_2O_3$ crystal film is doped with Be near the surface thereof and is then annealed.

FIG. 6A is a measured data diagram showing the relationship between the depth from a surface of a $Ga_2O_3$ crystal film and Be concentration when the $Ga_2O_3$ crystal film is doped with Be near the surface thereof and is then annealed.

Figure 6B:
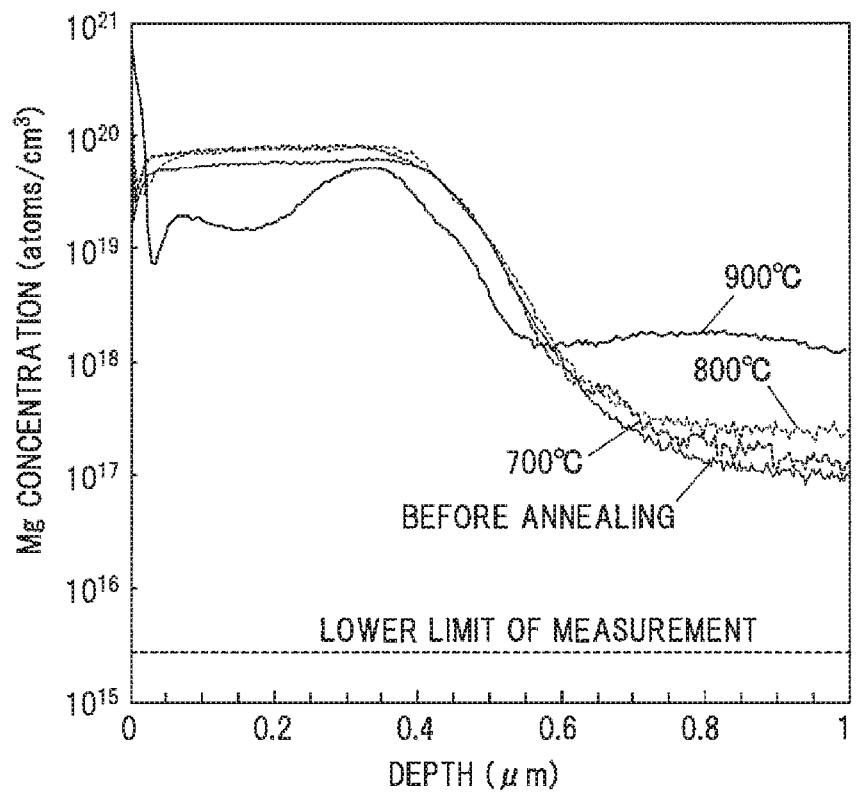
FIG. 6B is a measured data diagram showing the relationship between the depth from a surface of a $Ga_2O_3$ crystal film and Mg concentration when the $Ga_2O_3$ crystal film is doped with Mg near the surface thereof and is then annealed.

FIG. 6B is a measured data diagram showing the relationship between the depth from a surface of a $Ga_2O_3$ crystal film and Mg concentration when the $Ga_2O_3$ crystal film is doped with Mg near the surface there and is then annealed.

Figure 7:
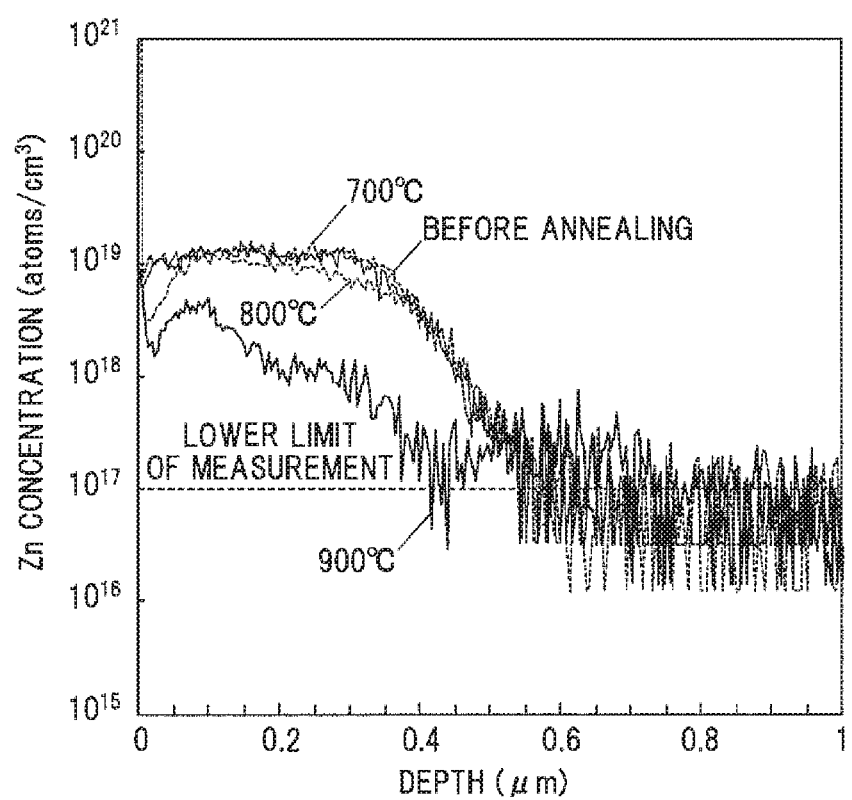
FIG. 7 is a measured data diagram showing the relationship between depth from a surface of a $Ga_2O_3$ crystal film and Zn concentration when the $Ga_2O_3$ crystal film is doped with Zn near the surface thereof and is then annealed.

FIG. 7 is a measured data diagram showing the relationship between the depth from a surface of a $Ga_2O_3$ crystal film and Zn concentration when the $Ga_2O_3$ crystal film is doped with Zn near the surface thereof and is then annealed.

As shown in FIGS. 6A, 6B and 7, all of Be, Mg and Zn are diffused in the $Ga_2O_3$ crystal films by annealing and the amount of diffusion increases with an increase in the annealing temperature. These results show that the acceptor impurity is diffused from the high-resistivity substrate 11 into the buffer layer 12 and the channel layer 13 even when the acceptor impurity doped into the high-resistivity substrate 11 in the first embodiment is Be, Mg or Zn.

Second Embodiment

The second embodiment is different from the first embodiment in that an upper portion of the buffer layer and the channel layer do not contain the acceptor impurity. The explanation for the same features as those in the first embodiment will be omitted or simplified below.

(Configuration of Semiconductor Element)

Figure 8:
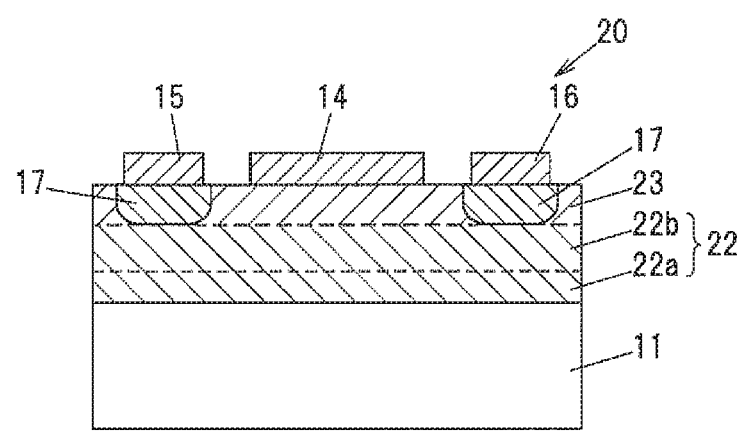
FIG. 8 is a vertical cross-sectional view showing a $Ga_2O_3$-based semiconductor element in a second embodiment.

FIG. 8 is a vertical cross-sectional view showing a $Ga_2O_3$-based semiconductor element 20 in the second embodiment. The $Ga_2O_3$-based semiconductor element 20 has a buffer layer 22 formed on the high-resistivity substrate 11, a channel layer 23 formed on the buffer layer 22, the source electrode 15 and the drain electrode 16 which are formed on the channel layer 23, the gate electrode 14 formed on the channel layer 23 so as to be located between the source electrode 15 and the drain electrode 16, and the contact regions 17 formed in the channel layer 23 so as to be located under the source electrode 15 and the drain electrode 16.

The buffer layer 22 is formed of a β-$Ga_2O_3$-based single crystal and has a lower portion 22a located on the high-resistivity substrate 11 side and containing the acceptor impurity diffused from the high-resistivity substrate 11, and an upper portion 22b located on the channel layer 23 side and not containing the acceptor impurity.

The buffer layer 22 is formed by epitaxially growing a β-$Ga_2O_3$-based single crystal on the high-resistivity substrate 11 used as a base substrate. The acceptor impurity diffuses from the high-resistivity substrate 11 into the buffer layer 22 during the epitaxial growth.

As mentioned above, the acceptor impurity concentration of the buffer layer 12 and the channel layer 13 in the first embodiment decreases with an increase in a distance from the high-resistivity substrate 11 in the depth direction.

For example, in the example shown in FIG. 5, when the $Ga_2O_3$ epitaxial layer is grown on the high-resistivity $Ga_2O_3$ substrate having a principal surface oriented to (010) at a growth temperature of 1000° C., the acceptor impurity is barely contained in a region of the $Ga_2O_3$ epitaxial layer at a distance of not less than 1 μm from the high-resistivity substrate 11 in the depth direction (thickness direction).

In this case, when the $Ga_2O_3$ epitaxial layer having a thickness of more than 1 μm from the surface of the high-resistivity substrate 11 is used as the buffer layer 22, a region at a distance of less than 1 μm from the high-resistivity substrate 11 in the thickness direction is the lower portion 22a and a region at a distance of not less than 1 μm from the high-resistivity substrate 11 in the thickness direction is the upper portion 22b.

Meanwhile, in the example shown in FIG. 5, when the $Ga_2O_3$ epitaxial layer is grown on the high-resistivity $Ga_2O_3$ substrate having a principal surface oriented to (001) at a growth temperature of 1000° C., the acceptor impurity is barely contained in a region of the $Ga_2O_3$ epitaxial layer at a distance of not less than 0.18 μm from the high-resistivity substrate 11 in the thickness direction.

In this case, when the $Ga_2O_3$ epitaxial layer having a thickness of more than 0.18 μm from the surface of the high-resistivity substrate 11 is used as the buffer layer 22, a region at a distance of less than 0.18 μm from the high-resistivity substrate 11 in the thickness direction is the lower portion 22a and a region at a distance of not less than 0.18 μm from the high-resistivity substrate 11 in the thickness direction is the upper portion 22b.

The channel layer 23 is formed of a β-Ga$_2$O$_3$-based single crystal containing a donor impurity. The donor impurity is preferably a Group IV element such as Si or Sn.

Since the base crystal of the channel layer 23 is the β-Ga$_2$O$_3$-based single crystal in the same manner as the buffer layer 22, the buffer layer 22 and the channel layer 23 can be continuously formed by epitaxial growth. The thickness of the channel layer 23 is, e.g., about 10 to 1000 nm.

The channel layer 23, which is formed on the upper portion 22b not containing the acceptor impurity, thus does not contain the acceptor impurity and has a higher conductivity than the channel layer 13 in the first embodiment.

Third Embodiment

The third embodiment employs a MISFET (Metal Insulator Semiconductor Field Effect Transistor) as the semiconductor element. The explanation for the same features as those in the first embodiment will be omitted or simplified below.

(Configuration of Semiconductor Element)

Figure 9:
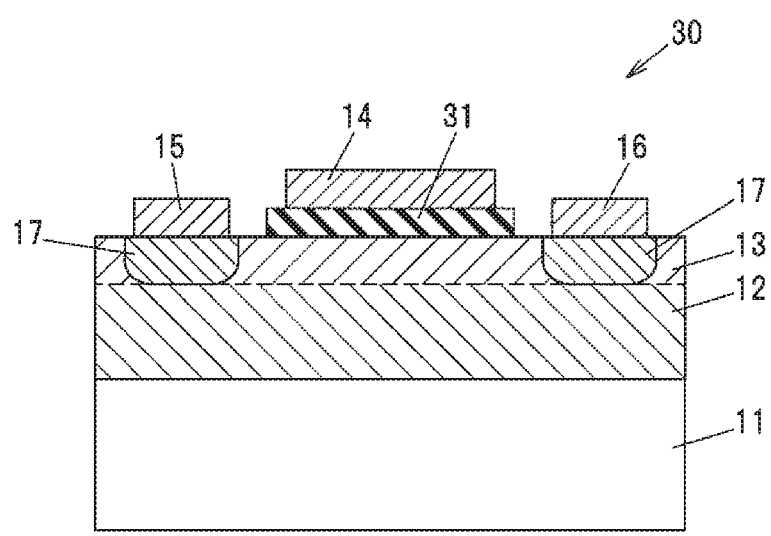
FIG. 9 is a vertical cross-sectional view showing a $Ga_2O_3$-based semiconductor element in a third embodiment.

FIG. 9 is a vertical cross-sectional view showing a Ga$_2$O$_3$-based semiconductor element 30 in the third embodiment. The Ga$_2$O$_3$-based semiconductor element 30 has the buffer layer 12 formed on the high-resistivity substrate 11, the channel layer 13 formed on the buffer layer 12, the source electrode 15 and the drain electrode 16 which are formed on the channel layer 13, the gate electrode 14 formed on the channel layer 13 via a gate insulating film 31 so as to be located between the source electrode 15 and the drain electrode 16, and the contact regions 17 formed in the channel layer 13 so as to be located under the source electrode 15 and the drain electrode 16.

The gate insulating film 31 is formed of an insulating material such as Al$_2$O$_3$.

The Ga$_2$O$_3$-based semiconductor element 30 can be a normally-on type or a normally-off type depending on the donor concentration and the thickness of the channel layer 13 directly below the gate electrode 14.

In case that the Ga$_2$O$_3$-based semiconductor element 30 is a normally-on type, the source electrode 15 is electrically connected to the drain electrode 16 via the channel layer 13. Therefore, if a voltage is applied between the source electrode 15 and the drain electrode 16 in a state that a voltage is not applied to the gate electrode 14, a current passes through from the source electrode 15 to the drain electrode 16. On the other hand, if a voltage is applied to the gate electrode 14, a depletion layer is formed in the channel layer 13 in a region under the gate electrode 14 and a current does not pass through from the source electrode 15 to the drain electrode 16 even if a voltage is applied between the source electrode 15 and the drain electrode 16.

In case that the Ga$_2$O$_3$-based semiconductor element 30 is a normally-off type, a current does not pass through in a state that a voltage is not applied to the gate electrode 14 even if a voltage is applied between the source electrode 15 and the drain electrode 16. On the other hand, if a voltage is applied to the gate electrode 14, the depletion layer in the channel layer 13 in the region under the gate electrode 14 is narrowed, and a current passes through from the source electrode 15 to the drain electrode 16 if a voltage is applied between the source electrode 15 and the drain electrode 16.

In the Ga$_2$O$_3$-based semiconductor element 30, the channel layer 13 is formed on the high-resistivity substrate 11 via the buffer layer 12 and thus contains a low concentration of acceptor impurity, in the same manner as the Ga$_2$O$_3$-based semiconductor element 10 in the first embodiment. Therefore, an increase in resistance of the channel layer 13 due to carrier compensation can be suppressed.

Fourth Embodiment

The fourth embodiment employs a MISFET as the semiconductor element. The explanation for the same features as those in the second and third embodiments will be omitted or simplified below.

(Configuration of Semiconductor Element)

Figure 10:
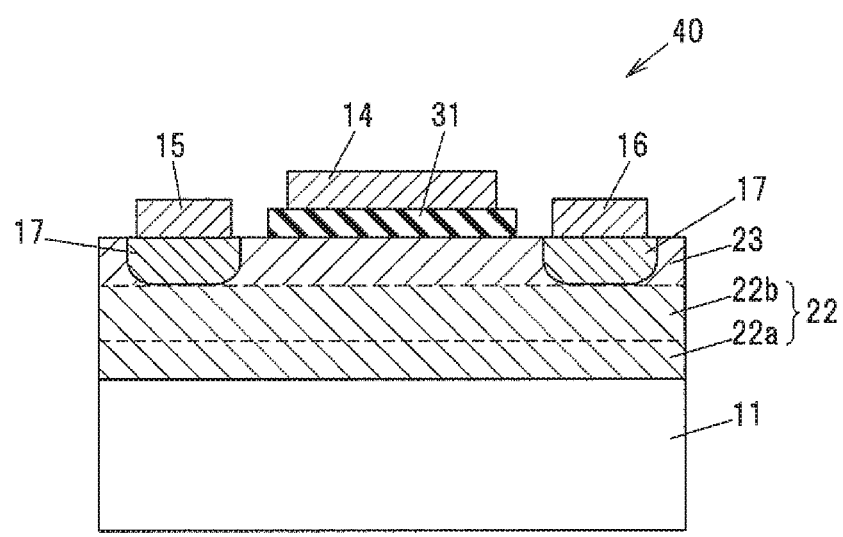
FIG. 10 is a vertical cross-sectional view showing a $Ga_2O_3$-based semiconductor element in a fourth embodiment.

FIG. 10 is a vertical cross-sectional view showing a Ga$_2$O$_3$-based semiconductor element 40 in the fourth embodiment. The Ga$_2$O$_3$-based semiconductor element 40 has the buffer layer 22 formed on the high-resistivity substrate 11, the channel layer 23 formed on the buffer layer 22, the source electrode 15 and the drain electrode 16 which are formed on the channel layer 23, the gate electrode 14 formed on the channel layer 23 via the gate insulating film 31 so as to be located between the source electrode 15 and the drain electrode 16, and the contact regions 17 formed in the channel layer 23 so as to be located under the source electrode 15 and the drain electrode 16.

In the Ga$_2$O$_3$-based semiconductor element 40, the channel layer 23 is formed on the acceptor impurity-free upper portion 22b of the buffer layer 22 and thus does not contain the acceptor impurity, in the same manner as the Ga$_2$O$_3$-based semiconductor element 20 in the second embodiment. Therefore, an increase in resistance of the channel layer 23 due to carrier compensation can be suppressed.

Effects of the Embodiments

In the first to fourth embodiments, since the channel layer contains a low concentration of the acceptor impurity diffused from the high-resistivity substrate or the channel layer barely contains the acceptor impurity, it is possible to suppress an increase in resistance of the channel layer due to carrier compensation.

Meanwhile, in general, an unintentional impurity or crystal defects due to polishing damage on a substrate are likely to be mixed/generated at an interface between a substrate and an epitaxial layer epitaxially grown thereon, and such unintentional impurity or crystal defects cause a leakage path to be formed in a semiconductor element. However, in the semiconductor elements in the first to fourth embodiments, the buffer layer is present between the high-resistivity substrate and the channel layer and the channel layer is located at a distance from the interface between the high-resistivity substrate and the buffer layer. Therefore, leakage caused by the impurity or crystal defects at the interface can be prevented.

Although the embodiments of the invention have been described above, the invention is not to be limited to the above-mentioned embodiments, and the various kinds of modifications can be implemented without departing from the gist of the invention.

In addition, constituent elements of the above-mentioned embodiments can be arbitrarily combined without departing from the gist of the invention.

In addition, the invention according to claims is not to be limited to the above-mentioned embodiments. Further, please note that all combinations of the features described in the embodiments are not necessary to solve the problem of the invention.

INDUSTRIAL APPLICABILITY

Provided are a semiconductor element in which an increase in resistance of a channel layer is suppressed, and a crystalline laminate structure which can be used to produce such element.

REFERENCE SIGNS LIST 10, 20, 30, 40: $Ga_2O_3$-BASED SEMICONDUCTOR ELEMENT
11: HIGH-RESISTIVITY SUBSTRATE
12, 22: BUFFER LAYER
13, 23: CHANNEL LAYER
22a: LOWER PORTION
22b: UPPER PORTION

The invention claimed is:

1. A semiconductor element, comprising:
   a high-resistivity substrate that comprises a beta-gallium oxide ($\beta$-$Ga_2O_3$)-based single crystal comprising iron (Fe) as an acceptor impurity at a first Fe concentration and includes a principal surface having a plane orientation of (001) or (010);
   a buffer layer disposed on the principal surface of the high-resistivity substrate, the buffer layer comprising a $\beta$-$Ga_2O_3$-based single crystal;
   a channel layer disposed on the buffer layer, the channel layer comprising a $\beta$-$Ga_2O_3$-based single crystal comprising a donor impurity; and
   a gate electrode disposed on a surface of the channel layer,
   wherein the buffer layer is in a direct contact with the channel layer,
   wherein the channel layer includes a same impurity material from the surface of the channel layer on which the gate electrode is disposed to an interface between the channel layer and the buffer layer,
   wherein the buffer layer has a thickness of not less than 0.18 μm when the principal surface of the high-resistivity substrate has the plane orientation of (001), or has a thickness of not less than 1 μm when the principal surface of the high-resistivity substrate has the plane orientation of (010),
   wherein the buffer layer suppresses diffusion of the Fe as the acceptor impurity from the high-resistivity substrate into the channel layer,
   wherein the buffer layer comprises Fe at a second Fe concentration which is lower than the first Fe concentration, and
   wherein the channel layer comprises Fe at a third Fe concentration which is lower than the second Fe concentration.

2. The semiconductor element according to claim 1, comprising a MESFET or a MISFET.

3. The semiconductor element according to claim 1, wherein the principal surface of the high-resistivity substrate has the plane orientation of (001), and
   wherein the second Fe concentration is less than $1\times10^{16}$ $cm^{-3}$ and not less than a lower limit of measurement in a region at a distance of 0.18 μm from an interface between the buffer layer and the substrate in a thickness direction.

4. The semiconductor element according to claim 1, wherein the principal surface of the high-resistivity substrate has the plane orientation of (010), and
   wherein the second Fe concentration is less than $1\times10^{16}$ $cm^{-3}$ and not less than a lower limit of measurement in a region at a distance of 1 μm from an interface between the buffer layer and the substrate in a thickness direction.

5. A crystalline laminate structure, comprising:
   a high-resistivity substrate that comprises a beta-gallium oxide ($\beta$-$Ga_2O_3$)-based single crystal comprising iron (Fe) as an acceptor impurity at a first Fe concentration and includes a principal surface having a plane orientation of (001) or (010);
   a buffer layer disposed on the principal surface the high-resistivity substrate, the buffer layer comprising a $\beta$-$Ga_2O_3$-based single crystal;
   a donor impurity-containing layer disposed on the buffer layer, the donor impurity-containing layer comprising a $\beta$-$Ga_2O_3$-based single crystal comprising a donor impurity; and
   a gate electrode disposed on a surface of the donor impurity-containing layer,
   wherein the buffer layer is in a direct contact with the donor impurity-containing layer,
   wherein the donor impurity-containing layer includes a same impurity material from the surface of the donor impurity-containing layer on which the gate electrode is disposed to an interface between the donor impurity-containing layer and the buffer layer,
   wherein the buffer layer has a thickness of not less than 0.18 μm when the principal surface of the high-resistivity substrate has the plane orientation of (001), or has a thickness of not less than 1 μm when the principal surface of the high-resistivity substrate has the plane orientation of (010),
   wherein the buffer layer suppresses diffusion of the Fe as the acceptor impurity from the high-resistivity substrate into the channel layer,
   wherein the buffer layer comprises a lower portion and an upper portion,
   wherein the lower portion of the buffer layer comprises Fe at a second Fe concentration which is lower than the first Fe concentration, and
   wherein the upper portion of the buffer layer and the channel layer do not comprise Fe.

6. The crystalline laminate structure according to claim 5, wherein the principal surface of the high-resistivity substrate has the plane orientation of (001), and
   wherein the second Fe concentration of the lower portion of the buffer layer is less than $1\times10^{16}$ $cm^{-}$ and not less than a lower limit of measurement in a region at a distance of 0.18 82 m from an interface between the buffer layer and the substrate in a thickness direction.

7. The crystalline laminate structure according to claim 5, wherein the principal surface of the high-resistivity substrate has the plane orientation of (010), and
   wherein the second Fe concentration of the lower portion of the buffer layer is less than $1\times10^{16}$ $cm^{-3}$ and not less than a lower limit of measurement in a region at a distance of 1 μm from an interface between the buffer layer and the substrate in a thickness direction.

* * * * *